United States Patent [19]

Klaassen

[11] Patent Number: 4,799,092
[45] Date of Patent: Jan. 17, 1989

[54] INTEGRATED CIRCUIT COMPRISING COMPLEMENTARY FIELD EFFECT TRANSISTORS

[75] Inventor: François M. Klaassen, Eindhoven, Netherlands

[73] Assignee: U.S. Philips Corporation, New York, N.Y.

[21] Appl. No.: 119,291

[22] Filed: Nov. 5, 1987

Related U.S. Application Data

[63] Continuation of Ser. No. 052,129, May 1, 1987, abandoned, which is a continuation of Ser. No. 656,623, Oct. 1, 1984, abandoned.

[30] Foreign Application Priority Data

Oct. 7, 1983 [NL] Netherlands .......................... 8303441

[51] Int. Cl.$^4$ ............................................. H01L 29/78
[52] U.S. Cl. .................................. 357/23.12; 357/42; 357/90
[58] Field of Search ................... 357/23.12, 90, 42, 59

[56] References Cited

U.S. PATENT DOCUMENTS

| | | | |
|---|---|---|---|
| 3,673,471 | 6/1972 | Klein | 357/42 |
| 4,178,605 | 12/1979 | Hsu | 357/42 |
| 4,472,871 | 9/1984 | Green | 357/23.12 |
| 4,476,482 | 10/1984 | Scott | 357/59 |

OTHER PUBLICATIONS

IEDM Technical Digest, Dec. 4–6, 1978, pp. 26–29 by Nishiuchi.

Primary Examiner—Andrew J. James
Assistant Examiner—Mark Prenty
Attorney, Agent, or Firm—Steven R. Biren

[57] ABSTRACT

An integrated circuit comprising complementary field effect transistors which are both of the normally-off depletion type. These transistors have, in the channel region a surface layer which has the same conductivity type as the adjoining source and drain zones. The surface layers comprise, per unit surface area, a quantity of dopant which is at least equal to the charge per unit surface area in the part of the substrate region which adjoins the surface layer and which is depleted if the threshold voltage is applied between the gate electrode and the source and drain zones. The gate electrodes comprise semiconductor material of opposite conductivity types.

8 Claims, 3 Drawing Sheets

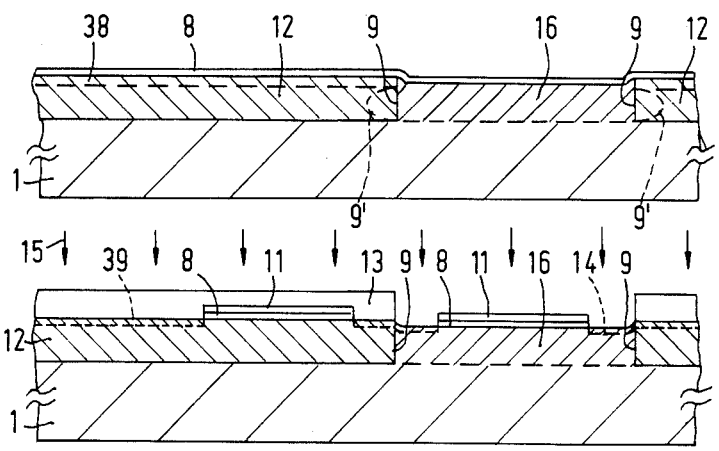
FIG.6
FIG.7
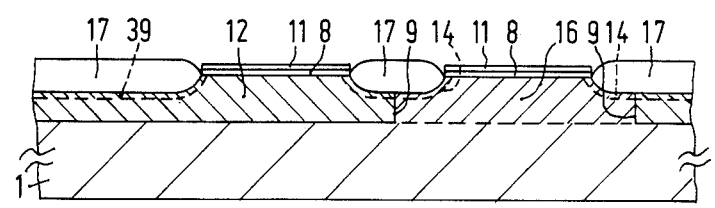
FIG.8
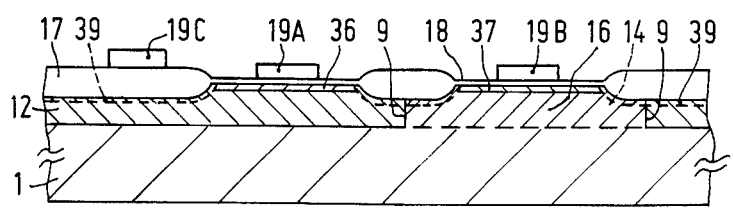
FIG.9
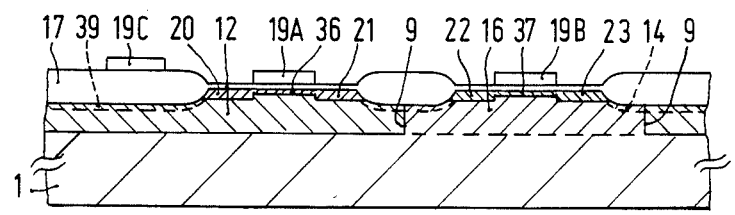
FIG.10

INTEGRATED CIRCUIT COMPRISING COMPLEMENTARY FIELD EFFECT TRANSISTORS

This is a continuation of application Ser. No. 052,129, filed May 1, 1987, which was a continuation of application Ser. No. 656,623, filed Oct. 1, 1984, both now abandoned.

BACKGROUND OF THE INVENTION

The invention relates to an integrated circuit comprising a semiconductor body having a major surface at which plural circuit elements are present, wherein the semiconductor body has near the major surface a first substrate region of a first conductivity type and a second substrate region of a second conductivity type, the first substrate region comprising a source and a drain zone of the second conductivity type of at least a first field effect transistor, a first channel region extending between these source and drain zones and at the major surface being covered by an insulating layer. A first gate electrode comprising semiconductor material is present on this insulating layer, and the second substrate region comprises a source and a drain zone of the first conductivity type of at least a second field effect transistor, a second channel region extending between these source and drain zones and at the major surface being covered by an insulating layer, and a second gate electrode comprising semiconductor material being present on this insulating layer, the semiconductor material of the first gate electrode and the semiconductor material of the second gate electrode being of opposite conductivity types.

Such an integrated circuit is known from U.S. Pat. No. 3,673,471 published on June 27th, 1972. In this known integrated circuit, the conductivity types of the first and the second gate electrode are the same as the conductivity type of the source and drain zones of the first field effect transistor and the conductivity type of the source and drain zones of the second field effect transistor, respectively. It is further known from U.S. Pat. No. 3,673,471 that the threshold voltage of a field effect transistor having an insulated gate of amorphous semiconductor material depends upon the conductivity type and upon the doping concentration of the amorphous semiconductor material.

The proposals according to the aforementioned U.S. Pat. No. 3,673,471 date from the early years of silicon gate technology. In those times it was usual to dope the gate electrodes simultaneously with the formation of the source and drain zones. In later years, and especially after the introduction of the ion implantation technique, that method of doping the gate electrodes was entirely driven out by a method in which the amorphous or polycrystalline semiconductor layer is n-doped with a high doping concentration during and/or immediately after the deposition. In the manufacture of CMOS circuits, this n-type semiconductor layer is now generally used for both types of field effect transistors, the threshold voltages of these field effect transistors being adjusted to the desired value by means of accurate implantation of a suitable dopant in the channel region. In this modified form, the silicon gate technology is thus far the essential part of the method of manufacturing integrated circuits comprising insulated gate field effect transistors.

It should be noted that in integrated circuits comprising complementary insulated gate field effect transistors the absolute values of the threshold voltages of the n-channel and the p-channel transistors are generally chosen to be substantially equal. These threshold voltages depend inter alia upon the doping concentration in the relevant substrate region, upon the quality, the composition and the thickness of the insulating layer constituting the relevant gate dielectric, upon the difference in work function of the semiconductor material of the substrate region and of the material of which the relevant gate electrode is made, and upon the doping concentration of the aforementioned implantation in the channel region. The said implantation treatment in practice has the great advantage that it provides the freedom to make a choice considered to be more or less optimal for each of the remaining parameters within wide limits in virtue of other dependences, such as the influence on the mutual conductance, on the value of (parasitic) capacitance and on the series resistance in the gate electrodes and/or the technological possibilities, and then to adapt the doping concentration of the implantation treatment to the choice made in a manner such that the threshold voltages of the transistors obtain the desired values which in absolute sense are substantially equal to each other.

Meanwhile, the dimensions of the field effect transistors used in integrated circuits have become increasingly smaller in the course of time. It has been found that particular effects are obtained in field effect transistors having very small dimensions. Thus, in field effect transistors having a small channel length of, for example, less than 3 $\mu$m the threshold voltage also depends upon this channel length. The term "channel length" is generally to be understood to mean the distance in the channel region between source and drain zone. In silicon gate technology, this channel length is directly derived from the width of the semiconductor track of the gate electrode.

When the field effect transistor structures used are further reduced in scale, so-called short-channel effects can be taken into account. Thus, the undesired decrease of the threshold voltage associated with a further reduction of the channel length can be counteracted entirely or in part by the use of the doping dose of the implantation by means of which the threshold voltage is adjusted.

A particularly disadvantageous consequence of shortchannel effects is that the threshold voltages of the transistor become sensitive to small variations in the manufacturing process and notably to small variations in the width of the semiconductor tracks constituting the gate electrodes.

SUMMARY OF THE INVENTION

The present invention has for its object to provide novel integrated circuits comprising complementary insulated gate field effect transistors, which can comprise transistors having comparatively short channels and can also be manufactured with a comparatively high yield. The invention further has for its object to decrease the sensitivity of the threshold voltages to short-channel effects in such integrated circuits by adaptation of the transistor structures, as a result of which a smaller spread in the threshold voltage can be obtained in manufacture.

The invention is based inter alia on the recognition of the fact that the improvement aimed at can be obtained by providing a particular adapted dopant in the channel region of the transistors.

According to the invention, an integrated circuit of the kind described above is characterized in that both in the first and in the second channel region between the said source and drain zones a surface layer adjoining the insulating layer links up with these zones, which surface layers are each of the same conductivity type as the adjoining source and drain zones, while the first and the second field effect transistor are both of the normally-off depletion type, and the quantity of dopant per unit surface area in each of the surface layers is at least equal to the quantity of charge per unit surface area in that part of the channel region which adjoins the surface layer and which is depleted if a voltage equal to the threshold voltage of the associated field effect transistor is applied to the associated gate electrode with respect to the source and drain zones of this field effect transistor.

It has surprisingly been found that, when the advantages inherent in the use of the same highly doped semiconductor layer in the gate electrodes of both types of field effect transistors, as is common practice hitherto, are abandoned and when in the obsolete structures having gate electrodes of opposite conductivity types both types of field effect transistors are replaced by normally-off depletion transistors having an adapted doping in the channel region, it is possible to obtain complementary field effect transistors having threshold voltages of approximately equal absolute values in the desired range of about 0 to 1 V, which are moreover comparatively insensitive to short-channel effects. It has been found to be desirable to choose the quantity of dopant in the surface layer of the channel regions of the transistors within comparatively narrow limits. On the one hand, the comparatively high lower limit indicated above holds for this dopant, whereas on the other hand the upper limit for this dopant is determined by the fact that the transistors have to be of the normally-off depletion type and the threshold voltages must have the desired value. Although normally-off depletion transistors having a very small threshold voltage can be realized, the threshold voltages for practical reasons will mostly not be smaller than about 0.5 V.

For the sake of completeness it should be noted that insulated gate field effect transistors of the normally-off depletion type are known per se, for example from I.E.E.E. Transactions on Electron Devices, Vol. ED-28, Nr. 9, September 1981, pp. 1025-1030. However, it cannot be deduced from this publication and comparable publications that improved circuits comprising field effect transistors can be obtained by replacing both types of transistors by normally-off depletion transistors having an adapted comparatively large quantity of dopant in the surface layer of the channel region.

The first and the second field effect transistors each have a comparatively small channel length which is substantially not larger than 3 $\mu$m and is preferably smaller than or equal to 1 $\mu$m. Especially with smaller channel lengths, the sensitivity of the threshold voltages to spread in the channel length in the usual integrated circuits increases and the yield of the manufacture of these circuits is adversely affected thereby.

Also, if in the integrated circuit according to the invention there are arranged beside first field effect transistors having a comparatively small channel length first field effect transistors having a comparatively large channel length, the threshold voltages of all first field effect transistors will be substantially equal to each other without additional treatments in the manufacture being required to this end. With the use of second field effect transistors of different channel lengths, the same advantage is obtained.

A preferred embodiment of the integrated circuit is characterized in that both in the first and in the second field effect transistor the ratio between the channel width and the channel length is at least 2. Due to the attained reduced influence of short-channel effects on the spread in the threshold voltages, the spread in the threshold voltages caused by narrow-channel effects could become predominant. With the indicated width-/length ratio, this risk is practically avoided.

Preferably, both in the first and in the second field effect transistor the conductivity type of the semiconductor material of the gate electrode is opposite to the conductivity type of the subjacent surface layer of the channel region. In this manner, the difference between the maximum permissible quantity of dopant in the surface layer and the indicated lower limit for this dopant is comparatively large and the desired normally-off character of the field effect transistors is less liable to be jeopardized.

In a further preferred embodiment, the first and the second gate electrode are directly connected to each other, the semiconductor material of the first gate electrode adjoining the semiconductor material of the second gate electrode while forming a semiconductor junction and this junction being shunted by a conductive connection. It has been found that the semiconductor junction formed at the interface between the first and the second gate electrode in many cases does not adversely affect the gate characteristics of the transistors. In other cases, however, it is advantageous to provide a conductive shunt in order to suppress any rectifying effect of this semiconductor junction.

Advantageously, the first and the second gate electrode each have a silicide top layer which is separated by the semiconductor material of the gate electrode from the insulating layer located under the gate electrode. The first and the second gate electrode preferably consist over at most half their thickness of silicide.

The silicide top layer reduces the series resistance of the gate electrodes and other semiconductor tracks, while this top layer moreover conductively shunts any semiconductor junctions present therein. The opposite conductivity types of the two gate electrodes and the influence thereof on the threshold voltages are maintained.

An important further preferred embodiment of the integrated circuit according to the invention is characterized in that both in the first and in the second field effect transistor the pn junction between the surface layer and the substrate region formed in the channel region lies at a depth under the semiconductor surface which is at least half the depth of the least deeply located pn junctions between the source and drain zones and the substrate region adjoining these zones. In practical embodiments of the integrated circuit according to the invention, the pn junctions of the source and drain zones of the p-channel and the n-channel transistors can be located at the same depth in the semiconductor body. The pn junctions of the channel regions are then preferably located at at least half this depth. In other cases, the source and drain zones of the n-channel transistors will have a smaller thickness than the source and drain zones of the p-channel transistors so that the pn junctions of the n-type source and drain zones are the least deeply located pn junctions. Both in the n-channel and in the p-channel transistors, the pn junctions of the surface layers are then preferably located at a depth which is at least equal to half the depth of the n-type source and drain zones.

The indicated depth of the pn junction limiting the surface layer provides a favorable effect on the punch-through voltage from the drain zone to the source zone of the transistor. It has been found that with surface layers with pn junctions located at a comparatively small depth the punch-through voltage is comparatively low.

BRIEF DESCRIPTION OF THE DRAWING

The invention will now be described more fully with reference to an embodiment and the accompanying diagrammatic drawing. In this drawing:

FIGS. 1 to 11 show in cross-section a semiconductor device according to the invention at different stages of manufacture;

FIG. 12 is a plan view of the part of this semiconductor device of which FIG. 11 shows a cross-section taken on the line XI—XI.

The Figures are schematic and not drawn to scale, while for the sake of clarity, as required, dimensions are greatly exaggerated. Corresponding parts are generally designated by the same reference numerals. In the plan view of FIG. 12, the contours of metal layers are indicated in dotted lines.

DESCRIPTION OF THE PREFERRED EMBODIMENTS

Figure 11:
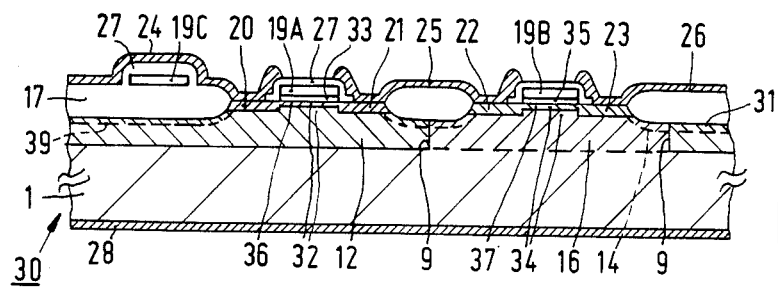
Figure 12:
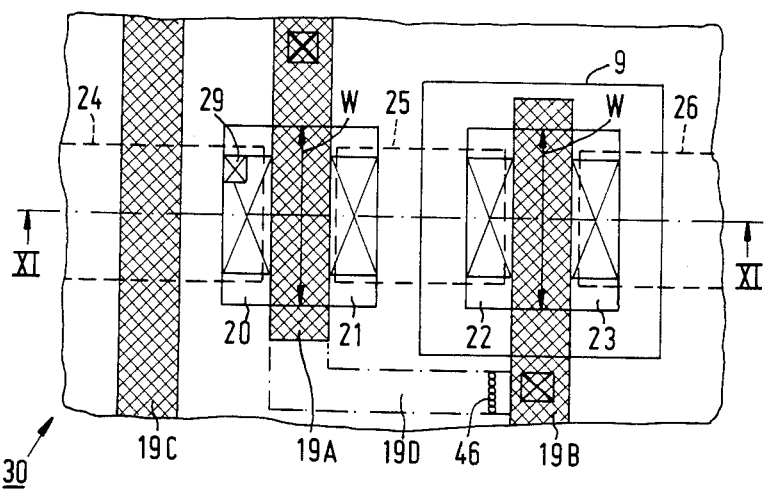

The embodiment is an integrated circuit, of which FIG. 12 shows a part and which comprises a semiconductor body 30 having a major surface 31 (FIG. 11) at which plural circuit elements 19A,20,21 and 19B,22,23 are present, wherein the semiconductor body 30 has near the major surface 31 a first substrate region 12 of a first conductivity type and a second substrate region 16 of a second conductivity type, while the first substrate region 12 comprises a source and a drain zone 20 and 21, respectively, of the second conductivity type of at least a first field effect transistor 19A,20,21 and there extends between these source and drain zones 20 and 21 a first channel region 32 which is covered at the major surface by an insulating layer 33, on which a first gate electrode 19A comprising semiconductor material is present, and wherein the second substrate region 16 comprises a source and a drain zone 22 and 23, respectively, of the first conductivity type of at least a second field effect transistor 19B,22,23, while there extends between these source and drain zones 22 and 23 a second channel region 34 which is covered at the major surface 31 by an insulating layer 35, on which a second gate electrode 19B comprising semiconductor material is present, the semiconductor material of the first gate electrode 19A and the semiconductor material of the second gate electrode 19B being of opposite conductivity types.

According to the invention, both in the first channel region 32 and in the second channel region 34 between the source and drain zones 20 and 21 and 22 and 23, respectively, a surface layer 36 and 37, respectively, adjoining the insulating layer 33 and 35, respectively, links up with these zones 20,21 and 22,23, respectively. The surface layer 36 has the same conductivity type as the source and drain zones 20 and 21 with which it links up and the surface layer 37 has the same conductivity type as the source and drain zones 22 and 23 with which it links up. The first and the second field effect transistor 19A,20,21 and 19B,22,23, respectively, are both of the normally-off depletion type, while moreover in each of the surface layers 36 and 37, respectively, the quantity of dopant per unit surface area of the semiconductor surface is at least equal to the quantity of charge per unit surface area in the part of the channel region 32 and 34, respectively, which adjoins the surface layer 36 and 37, respectively, and which is depleted if a voltage equal to the threshold voltage of the associated field effect transistor 19A,20,21 and 19B,22,23, respectively, is applied to the associated gate electrode 19A and 19B, respectively, with respect to the source and drain zones 20,21 and 22,23, respectively, of this field effect transistor 19A,20,21 and 19B,22,23, respectively.

Figure 1:
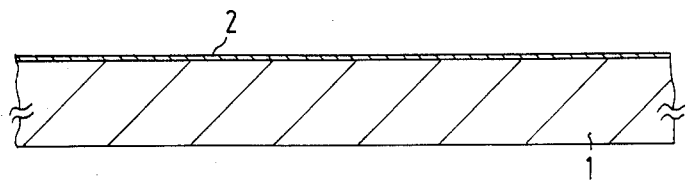
Figure 2:
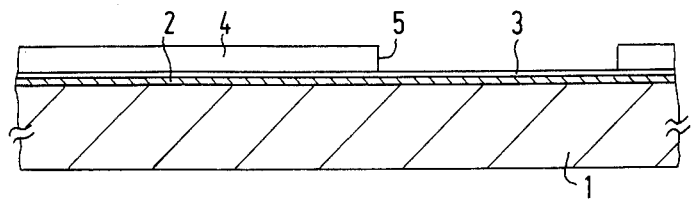
Figure 3:
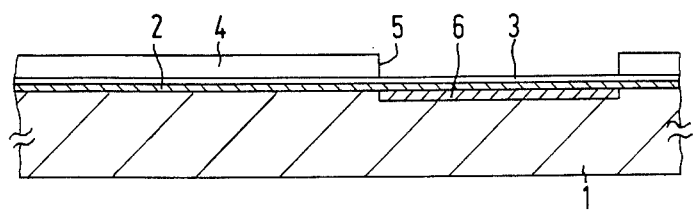

For the manufacture of this integrated circuit, the starting member may be, for example, a silicon wafer 1 having a resistivity of, for example, about 10–25Ω cm and preferably having a surface with a <100> orientation. A surface of this wafer is provided by implantation of phosphorus ions (energy 30 keV, dose $2.10^{14}$ ions/cm$^2$) with a thin n-type layer 2 (see FIG. 1) having a thickness less than 0.1 μm. By thermal oxidation the surface is now provided with a thin silicon oxide layer 3 having a thickness of about 30 nm. On this layer is provided a photolacquer layer 4 in which a window 5 is formed by exposure and development (see FIG. 2). Subsequently, the surface is bombarded with boron ions at an energy of 150 keV and a dose of also about $3.10^{14}$ ions/cm$^2$. The boron ions penetrate through the oxide layer 3, but are stopped by the photolacquer layer 4. Thus, a p-type layer 6 (see FIG. 3) is obtained, which is compensated for at least in part at the surface by the presence of the n-type doping concentration of the layer 2.

Figure 4:
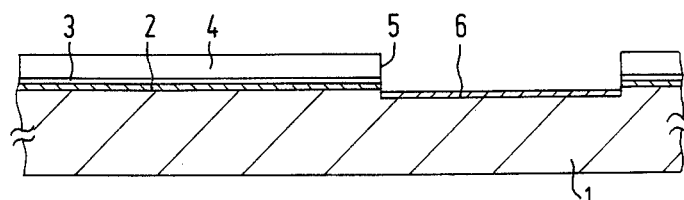
Figure 5:
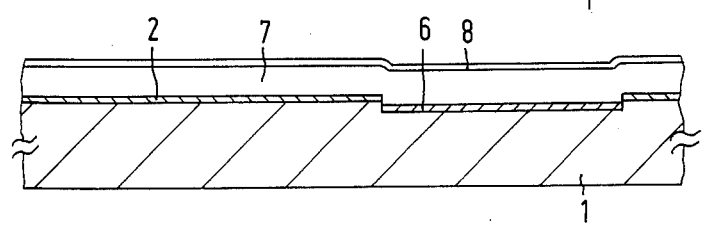

By etching, the oxide layer 3 and the layer 2 are then removed within the window 5 (see FIG. 4), after which the photolacquer mask 4 is removed. Subsequently, by the use of generally known techniques a 7.5 μm thick layer 7 of silicon is grown epitaxially on the surface. The layer 7 is doped during the growth with about $1.10^{16}$ phosphorus atoms/cm$^3$. The layer 7 is provided by thermal oxidation with an approximately 50 nm thick layer 8 of silicon oxide (see FIG. 5).

Subsequently, an implantation with boron ions is carried out in the region 16 at an energy of, for example, 60 keV and a dose of $5.10^{12}$ ions/cm$^2$. A photolacquer layer may be used as a mask.

Subsequently (see FIG. 6) a heat treatment is carried out at 1200° C. for 5 hours in nitrogen. During this heat treatment, the dopants diffuse from the buried layers 2 and 6 into the epitaxial layer 7 and into the substrate 1, the n-type region 12 and the p-type region 16 then being obtained, which have doping concentrations decreasing towards the surface at least over the major part of their thickness. At the surface a thin layer 38 with practically the original doping of the n-type epitaxial layer is left in the region 12. This layer 38 is not shown in the following Figures for the sake of simplicity. In the region 16 the surface-adjoining part of the epitaxial layer is overdoped due to the boron implantation carried out at this area so that the p-type region 16 extends as far as the semiconductor surface. The pn junction 9 between the regions 12 and 16 is substantially at right angles to the surface because the diffusion coefficients of boron and phosphorus at the same diffusion temperature are substantially the same and also the doping concentrations of the buried layers 2 and 6 are substantially equal. The lateral diffusions from the layers 2 and 6 consequently compensate each other substantially completely. For illustration, FIG. 6 shows by a dotted line the form (9') of the pn junction which would be obtained if only the buried layer 6 were present.

In this embodiment, complementary insulated gate field effect transistors are formed in the regions 12 and 16, each of the regions 12 and 16 serving as the substrate region for one of the two types of transistors.

For this purpose, a silicon nitride layer 11 having a thickness of about 150 nm is then deposited on the oxide layer 8 by the use of usual techniques (see FIG. 7).

Subsequently, by implantation of phosphorus ions at an energy of, for example, 70 keV and a dose of $1.10^{12}$ ions/cm$^2$ n-type conducting channel stopper zones 39 are formed. The pattern formed from the layers 8 and 11 then serves as an implantation mask. Subsequently, while using the same mask as for forming the window 5, a photolacquer mask 13 is provided. While using the photolacquer layer 13 and the nitride-oxide layers 8, 11 as a mask, boron ions 15 are then implanted (see FIG. 7) at a dose of $5.10^{13}$ ions/cm$^2$ and an energy of 16 keV for forming channel stopper regions 14 with an increased p-type doping concentration, which boron implantation overdopes the previous phosphorus implantation.

Subsequently, the photolacquer layer 13 is removed and a thermal oxidation is carried out at 1000° C. for 2 hours, as a result of which a partly sunken oxide pattern 17 having a thickness of about 0.6 μm is obtained on the parts of the surface not covered by the nitride layer 11 (see FIG. 8).

Now the layers 11 and 8 are etched away, after which by thermal oxidation a gate oxide layer 18 is formed having a thickness of 50 nm (see FIG. 9).

There is now formed on the semiconductor body a photolacquer layer according to a pattern which leaves free the active regions which are intended for the p-channel transistors. This pattern serves as a mask during a boron implantation in which a dose of about $6.10^{11}$ ions/cm$^2$ is provided at an energy of 30 keV. This implantation serves for forming the surface layer 36. Subsequently, the photolacquer layer is replaced by a fresh photolacquer layer according to a pattern which leaves free the active regions intended for the n-channel transistors. This pattern serves as a mask during a phosphorus implantation in which a dose of about $6.10^{11}$ ions/cm$^2$ is provided at an energy of 30 keV. This implantation serves to form the n-type surface layer 37. Subsequently, from the gaseous phase an approximately 0.5 μm thick polycrystalline silicon layer 19 is deposited on the whole surface. On the layer 19 a non-critical mask, for example a photolacquer layer, is provided, by which that part of the layer 19 from which the gate electrode 19B is to be made, is covered. The remaining part of the layer 19, which comprises the ultimate gate electrode 19A and the conductor track 19C, is n-doped by implantation with a high donor concentration. Subsequently, this implantation mask (not shown) is removed and is replaced by a next implantation mask, which leaves free the previously covered part of the layer 19 and covers the already doped part of the layer 19. The exposed part of the layer 19 is p-type doped by implantation with a high acceptor concentration. After the polycrystalline silicon layer 19 has been provided with a thin oxide layer (not shown), this oxide layer and the polycrystalline silicon layer 19 are together patterned in a usual manner by etching.

In a usual manner, the source and drain zones 22 and 23 of the n-channel transistor are formed by implantation of arsenic ions and the source and drain zones 20 and 21 of the p-channel transistor are formed by implantation of boron ions, the gate electrode layers 19 and the oxide pattern 17 serving as a mask (see FIG. 10). The arsenic implantation then does not overdope the acceptor concentration present in the gate electrode 19B. Furthermore, the surface parts of the semiconductor body which must not be exposed to the relevant ions are then each time covered in a usual manner by a non-critical mask, for example a photolacquer mask. The n-type source and drain zones have, for example, a sheet resistance of about 30Ω/square and the sheet resistance of the p-type source and drain zones is, for example, about 50 Ω/square. The said implantation treatments can be followed by a heat treatment of about 20 minutes at about 950° C.

Finally, the assembly is covered by a layer 27 of pyrolytic SiO$_2$ into which contact windows are etched (see FIG. 11). By metallization with, for example, aluminum and by etching, the metal layers 24,25 and 26 are obtained, which contact within the contact windows the zones 20-23 and the gate electrodes 19. In the plan view of FIG. 12, diagonal lines are drawn in the contact windows.

The complementary MOS transistors thus obtained are separated by a pn junction 9 which traverses the epitaxial layer in a direction at right angles to the surface.

Instead of a p-type substrate, an n-type substrate could alternatively be used. The n-channel transistor would then be situated in an island-shaped region 16 which is entirely surrounded by n-type material.

In the embodiment described, the buried layers 2 and 6 were obtained by first providing the layer 2 over the whole surface, then forming the layer 6 in a part of the surface and subsequently etching away the surface layer of the region 6 occupied by the layer 2. Instead, the layers 2 and 6 may alternatively be provided by local diffusion or implantation directly beside each other or so as to overlap each other. For example, first an anti-oxidation mask leaving free the parts of the surface to be doped with phosphorus may be formed on the surface of the substrate 1. After the phosphorus implantation, which is locally carried out with this mask, an oxidation treatment is carried out. The oxide layer or layers then formed serves or serve, after removal of the aforementioned anti-oxidation mask, as a mask during the boron implantation, which in this case can take place at an energy of 40 keV. After removal of the oxide layers which have served as an implantation mask, the epitaxial layer can be grown. Furthermore, the layers 2 and 6 may be arranged at a small relative distance. This distance is then preferably so small that during the diffusion the diffused regions 12 and 16 adjoin each other.

It should be noted that the substrate regions 12 and 16 of both field effect transistors are contacted by a metal layer 28 provided on the back side of the semiconductor wafer (see FIG. 11) and by the region 12 being short-circuited through a recess in the source zone 20 within the contact window 29 with the zone 20 (see FIG. 12). With a comparatively high-ohmic substrate, as in this case, it may be advantageous also to contact the region 16 at the upper surface in the same manner as the region 12.

It should be noted that the CMOS structure and the associated manufacturing method and especially the construction of the substrate regions 12 and 16 described above relate to a preferred embodiment. Within the scope of the present invention, it is of importance that the doping in the surface-adjoining parts of the substrate regions 12 and 16, in which the channel regions 32 and 34 are situated, is independent of accidental variations in the thickness of the epitaxial layer 7 and in the doping of the buried layers 2 and 6. In the substrate region 12, the doping concentration near the surface is determined by the doping concentration of the grown epitaxial layer 7, of which in fact the thin layer 38 is left. In the substrate region 16, the doping concentration in the channel region 34 is defined by the described boron implantation, which was carried out in situ after the epitaxial layer had been grown. These accurately defined doping concentrations facilitate the determination and the introduction of the desired quantity of dopant for the surface layers 36 and 37 of the transistors.

However, it is alternatively possible to start from other known structures and methods for integrated circuits comprising complementary insulated gate field effect transistors. For example, structures having a p-well in an n-type substrate or having an n-well in a p-type substrate or structures having a p-well and an n-well in or on a common substrate manufactured by methods different from that described above may be realized. Starting from these or other structures, the adaptation required for obtaining devices according to the invention is mainly limited to the provision of gate electrodes of the correct conductivity type and with a suitable doping concentration and to the formation of suitable surface layers in the channel regions of the two types of field effect transistors.

Figure 13:
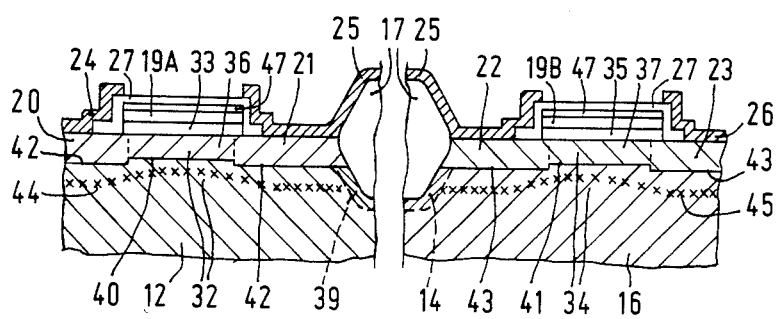
FIG. 13 shows a part of the cross-section of FIG. 11 on an enlarged scale.

FIG. 13 shows again, and on an enlarged scale, part of the cross-section of FIG. 11. FIG. 13 is also schematic and not drawn to scale. When the surface layers 36 and 37 are provided in the channel regions 32 and 34, pn junctions 40 and 41 have formed. These pn junctions 40,41 each are integral with the pn junctions 42 and 43, respectively, which separate source and drain zones 20 and 21 and 22 and 23, respectively, adjoining the surface layer 36 and 37, respectively, from the relevant substrate region 12 and 16, respectively. To these pn junctions 40,42 and 41,43, respectively, belongs a depletion region, whose boundary in the substrate region 12 and 16, respectively, is indicated in FIG. 13 diagrammatically by a cross-marked line 44 and 45, respectively. These boundaries 44 and 45, respectively, of the depletion regions are shown for the case in which a voltage equal to the threshold voltage of the relevant transistor is applied to the gate electrode 19A and 19B, respectively, with respect to the source and drain zones 20,21 and 22,23, respectively. This threshold voltage is for the n-channel transistor, for example, about $+0.8$ to $+0.9$ V, the source and drain zones 20 and 21 and the substrate region 12 being, for example, at a voltage of 0 V. The threshold voltage of the p-channel transistor is, for example, about $-0.8$ to $-0.9$ V. The voltage at the gate electrode 19B, is, for example, $+4.1$ to $+4.2$ V, while the voltage at the source and drain zones 22,23 and the substrate region 16 is about $+5$ V.

It should be noted that in the integrated circuit according to the invention field effect transistors may also be present, in which during operation the voltage between the source zone and the substrate region is not equal to zero. Due to such a voltage difference, the threshold voltage measured between the source zone and the gate electrode and at which the transistor passes from the non-conducting to the conducting state is modified. For determining the value of the minimum quantity of dopant in the surface layer to be used in accordance with the invention, the last-mentioned actual threshold voltage in the operating condition is taken into account. As far as the integrated circuit comprises field effect transistors of the same type with different actual threshold voltages, the doping of the surface layer in the channel region is preferably determined in such a manner that at any rate in the transistor with the threshold voltage of the smallest absolute value at least the proposed minimum quantity of dopant is present.

It has been found that in the p-channel transistor 19A,20,21 the thickness of the part of the depletion layer in the channel region 32 located in the n-type substrate region 12 is about 0.25 $\mu$m. In the channel region 32, the distance between the pn junction 40 and the boundary 44 is consequently about 0.25 $\mu$m. The dopings are then chosen so that the pn junction 40 and the boundary 44 are both located within the remaining thin layer 38 of the epitaxial layer 7. Per unit surface area of the major surface 31, the charge in the part of the depletion layer in the channel region 32 located between the pn junction 40 and the boundary 44 is about $0.25 \cdot 10^{-4} \cdot 1 \cdot 10^{16}$ atoms/cm$^2$ = $2.5 \cdot 10^{11}$ atoms/cm$^2$. The dose for the boron implantation for obtaining the surface layer 36 was determined at about $6.10^{11}$ atoms/cm$^2$, as a result of which the net acceptor charge in this surface layer is also about $3.5 \cdot 10^{11}$ atoms/cm$^2$. The quantity of dopant in the surface layer 36 is then $1.10^{11}$ atoms/cm$^2$ higher than the lower limit indicated for this doping in accordance with the present invention. Furthermore, the energy for the said phosphorus implantation is chosen so that, taking into account the heat treatment carried out during the manufacture, the pn junction 40 in the channel region 32 lies about 0.25 $\mu$m under the semiconductor surface.

The n-channel transistor 19B,22,23 is also composed in a corresponding manner. The pn junction 41 lies at a distance of about 0.25 $\mu$m under the semiconductor surface and the thickness of the part of the depletion layer located in the substrate region 16 (the distance between the pn junction 41 and the boundary 45) is about 0.25 $\mu$m. The energy and the dose of the boron implantation carried out for overdoping the aforementioned remaining thin layer of the epitaxial material are chosen so that down to a depth of at least 0.5 $\mu$m under the semiconductor surface an average doping concentration of about $1.10^{16}$ acceptor atoms/cm$^3$ may be expected. At the said dose of $6.10^{11}$ atoms/cm$^2$ for the phosphorus implantation for obtaining the surface layer 37, the net donor charge per unit surface area of the semiconductor surface in this surface layer is also about $1.10^{11}$ atoms/cm$^2$ higher than the indicated lower limit.

Both the p-channel and the n-channel transistors are of the depletion type, the source and the drain zone and the surface layer located in the channel region forming a continuous region of the same conductivity type. This continuous region adjoins a substrate region of the opposite conductivity type. Both types of transistors are normally-off transistors, in which in the operating condition in the absence of a voltage difference between the gate electrode and the source zone of the relevant field effect transistor no or substantially no current flows through the main current path of the transistor. No conductive connection is then present between the source and the drain zone provided that the voltage difference between the source and the drain zone is smaller than the punch-through voltage.

An increase of the implantation dose for the surface layer leads in both types of field effect transistors to a decrease of the absolute value of the threshold voltage. The maximum permissible implantation dose is equal to the dose at which the threshold voltage has decreased practically to the value zero. In the embodiment described, this maximum dose is about $8.5 \cdot 10^{11}$ atoms/cm$^2$. In this connection, the gate electrodes 19A and 19B preferably have a conductivity type which is opposite to that of the source and drain zones 20, 21 and 22, 23, respectively, of the relevant field effect transistor. In this preferred embodiment, the difference between the maximum permissible dose and the indicated minimum dose is at its largest. In the converse situation, in which the gate electrodes have the same conductivity type as the source and drain zones, the threshold voltages of both types of field effect transistors have substantially the same absolute values, it is true, but with the use of the minimum implantation dose they have a comparatively small value and the normally-off character of the transistors may be jeopardized.

For the sake of completeness it should be noted that the threshold voltage may also be influenced by means of the doping concentration in the substrate region and to a small extent also by means of the doping concentration in the gate electrodes. The possibilities thus to adjust the threshold voltage to a desired value are limited, however, because in this case also other properties of the transistor, such as the value of parasitic capacitances, breakdown and/or punch-through voltages etc., are varied.

It has been found that with the use of the indicated quantity of dopant in the surface layers of the field effect transistors described, the threshold voltages of these field effect transistors are comparatively insensitive to short-channel effects. Notably in integrated circuits comprising complementary field effect transistors having a short channel length of, for example, at most 3 $\mu$m, the use of the present invention facilitates the manufacture with a comparatively high yield. A certain spread in the width of the conducting semiconductor tracks constituting the gate electrodes is now less liable to lead to an unacceptably large spread in the threshold voltages.

In the embodiment, the channel length of the transistors 19A, 20, 21 and 19B, 22, 23 is about 1 $\mu$m.

It has further been found that in the integrated circuit according to the invention the threshold voltages are relatively less dependent upon the thickness of the insulating layers 33 and 35 than with the use of field effect transistors of the enhancement type. When the transistor dimensions are reduced, the thickness of the gate insulation layer can be chosen more freely. Notably, if required, a slightly thicker gate insulation layer can be used than is desirable in the case of enhancement transistors having comparable dimensions, as a result of which the yield can be increased.

Furthermore, in the integrated circuit according to the invention, the penetration depth of the source and drain zones of the transistors can be optimized practically independently of the threshold voltages. In the conventional complementary field effect transistors of the enhancement type, the influence of short-channel effects increases with increasing penetration depth of the source and drain zones. Therefore, with decreasing transistor dimensions, the penetration depth of the source and drain zones is generally also decreased. With very shallow source and drain zones, problems with respect to contacting frequently arise, while moreover the series resistance in these zones can become too high. With the use of the invention, there are no objections against utilizing source and drain zones having a comparatively large penetration depth. In the embodiment described, the n-type source and drain zones 22 and 23 have, for example, a penetration depth of about 0.4 $\mu$m. The penetration depth of the p-type source and drain zones 20 and 21 is, for example, about 0.6 $\mu$m.

It is also of importance that in the integrated circuit according to the invention the threshold voltages are substantially not dependent upon the thickness of the surface layers 36 and 37 as long as the doping dose in these surface layers remains unchanged. Preferably, the pn junctions 40 and 41 lie at a depth under the semiconductor surface which is at least equal to half the depth of the least deeply located pn junctions 43 between the source and drain zones 22,23 and the substrate region 16 adjoining these zones 22, 23. The pn junctions 42 between the source and drain zones 20, 21 and the adjoining substrate region 12 are located at a larger depth under the semiconductor surface than the pn junctions 43. It has been found that the depth recommended for the pn junctions 40 and 41 is particularly favorable in connection with the punch-through voltage from the drain zone 23 and 21, respectively, to the source zone 22 and 20, respectively. If the pn junctions 40 and 41 are provided at a smaller depth than the indicated depth, punch-through occurs at lower voltages.

In an important preferred embodiment of the integrated circuit according to the invention, the ratio between the channel width and the channel length of the first and second field effect transistors is at least 2. In accordance with the invention, comparatively narrow channels are preferably avoided in order that the reduced sensitivity to short-channel effects may be fully utilized. As is known per se, the threshold voltage of the transistors may also depend upon the channel width with the use of narrow channels. The spread in the threshold voltages thus obtained can be reduced or avoided in accordance with the invention in that notably in the transistors having a comparatively small channel width the channel width is chosen not too narrow, that is to say at least a factor 2 larger than the channel length. In the embodiment, the channel width indicated in FIG. 12 by the arrow W is in the n-channel transistor about 2 $\mu$m and in the p-channel transistor about 4 $\mu$m.

In the embodiment, the gate electrodes 19A and 19B are indicated so as to be entirely mutually separated and they are each provided with an electrical connection. In many integrated circuits, the gate electrode of a p-channel transistor and the gate electrode of an n-channel transistor will be directly connected to each other and will be constituted by a continuous semiconductor track. In FIG. 12, such a direct connection is indicated diagrammatically by the semiconductor connection track 19D denoted by dot-and-dash lines. Since the gate electrodes 19A and 19B are of opposite conductivity types, there will be located in the connection track 19D a pn junction, which is designated by reference numeral 46. In many cases, this pn junction 46 which mostly is highly doped on both sides will exert no or substantially no disadvantageous effects on the gate characteristics of the field effect transistors. However, as far as this pn junction 46 is undesirable, a shortcircuit may be provided. This may be effected, for example, by enlarging the contact window located near the pn junction 46 above the gate electrodes 19B in such a manner that this window extends beyond the pn junction 46.

In accordance with the invention, in an otherwise known manner, the semiconductor tracks of the gate electrodes are preferably provided with a silicide layer. Suitable silicides are, for example, tungsten silicide and molybdenum silicide. The silicide layer can be provided by depositing a layer of the relevant metal on the polycrystalline or amorphous semiconductor layer 19, after which silicide can be formed by heating. Further, a layer of the desired silicide may also be deposited on the semiconductor layer 19 by sputtering. The silicide layer of the gate electrodes 19A and 19B is designated by reference numeral 47 in FIG. 13. The silicide top layer 47 is separated by semiconductor material of the gate electrodes 19A and 19B from the underlying gate dielectric 33 and 35, respectively. The gate electrodes 19A and 19B and semiconductor tracks 19C and 19D provided with a silicide top layer 47 have a comparatively low series resistance, while moreover any pn junctions 46 present in the semiconductor tracks 19D are conductively shunted by the silicide so that they are shortcircuited. The gate electrodes preferably consist over at most half their thickness of silicide.

Alternatively, the silicide top layer or the metal layer provided for the formation of this top layer may be removed from the gate electrodes with the aid of a mask, for example by selective etching, so that only the further semiconductor tracks extending over the field oxide have been or are provided with a silicide layer. These further semiconductor tracks may also consist of silicide over their whole thickness.

The invention is not limited to the embodiment described. Within the scope of the invention, many variations are possible for those skilled in the art. For example, semiconductor materials other than silicon, such as germanium or $A^{III}$-$B^{V}$ compounds, such as GaAs, and other insulating and/or masking layers may be used. The use of an oxide pattern 17 sunken at least in part into the semiconductor body is, though desirable in many cases, not necessary. The indicated donor and acceptor atoms may be replaced by other donor and acceptor atoms, while concentrations and diffusion coefficients are adapted to each other and, as the case may be, also the implantation energy and/or the duration and/or the temperature of heat treatments are adapted to attain the desired result. The buried layers 2 and 6 may alternatively be obtained by doping methods other than ion implantation, for example, by diffusion from the gaseous phase or from a doped oxide or glass layer.

In the integrated circuit described, of course, plural first field effect transistors and plural second field effect transistors may be present. In addition to field effect transistors having a comparatively small channel length, field effect transistors having a larger channel length may be used. In this case, the threshold voltages of these different field effect transistors of the normally-off depletion type are practically equal to each other without additional treatments being required in manufacture.

The integrated circuit according to the invention may also comprise other circuit elements than the shown normally-off depletion transistors, which are integrated on and/or in the same semiconductor body. Other circuit elements may be, for example, resistors or diodes or field effect transistors of the enhancement or the depletion type or bipolar transistors.

What is claimed is:

1. An integrated circuit comprising a semiconductor body having a major surface, plural circuit elements located at said surface, the semiconductor body comprising, near the major surface, a first substrate region of a first conductivity type and a second substrate region of a second conductivity type, at least a first field effect transistor, the first substrate region comprising a source and a drain zone of the second conductivity type of said at least first field effect transistor, a first insulating layer, a first channel region extending between said source and drain zones and at the major surface being covered by said first insulating layer, a first gate electrode comprising semiconductor material on said first insulating layer, at least a second field effect transistor, the second substrate region comprising a source and a drain zone of the first conductivity type of said at least second field effect transistor, a second insulating layer, a second channel region extending between said source and drain zones and at the major surface being covered by said second insulating layer, and a second gate electrode comprising semiconductor material on said second insulating layer, the semiconductor material of the first gate electrode and the semiconductor material of the second gate electrode being of opposite conductivity types to each other, a thin surface layer in each of the first and second channel regions, located between and adjoining said source and drain zones and adjoining the insulating layer, which surface layers are each of the same conductivity type as the adjoining source and drain zones, the maximum doping level of said thin surface layers being sufficiently low such that said first and second field effect transistors are both of the normally-off depletion type, the minimum doping level per unit surface area in each of the thin surface layers being at least equal to the quantity of charge per unit surface area in the part of the channel region which is depleted if a voltage equal to the threshold voltage of the associated field effect transistor is applied to the associated gate electrode with respect to the source and drain zones of said associated field effect transistor and which adjoins the surface layer.

2. An integrated circuit as claimed in claim 1, characterized in that the first and the second field effect transistors each have a channel length which is smaller than 3 μm.

3. An integrated circuit as claimed in claim 1 or 2, characterized in that both in the first and in the second field effect transistors the ratio between the channel width and the channel length is at least 2.

4. An integrated circuit as claimed in claim 1 or 2, characterized in that both in the first and in the second field effect transistors the conductivity type of the semiconductor material of the gate electrode is opposite to the conductivity type of the subjacent surface layer of the channel region.

5. An integrated circuit as claimed in claim 1 or 2, characterized in that the first and the second gate electrodes are directly connected to each other, the semiconductor material of the first gate electrode forming a junction with and adjoining the semiconductor material of the second gate electrode and this junction being shunted by a conductive connection.

6. An integrated circuit as claimed in claim 1 or 2 characterized in that the first and the second gate electrodes each have a silicide top layer, which silicide top layer is separated by the semiconductor material of the gate electrode from the insulating layer located under the gate electrode.

7. An integrated circuit as claimed in claim 6, characterized in that the first and the second gate electrodes comprise silicide over at most half their thickness.

8. An integrated circuit as claimed in claim 1 or 2, characterized in that both in the first and in the second field effect transistor the pn junction between the surface layer and the substrate region formed in the channel region is located at a depth under the semiconductor surface which is at least half the depth of the least deeply located pn junctions between the source and drain zones and the substrate region adjoining these zones.

* * * * *